United States Patent
Kurczveil et al.

(10) Patent No.: US 10,811,549 B2
(45) Date of Patent: Oct. 20, 2020

(54) QUANTUM-DOT-BASED AVALANCHE PHOTODIODES ON SILICON

(71) Applicant: HEWLETT PACKARD ENTERPRISE DEVELOPMENT LP, Houston, TX (US)

(72) Inventors: Geza Kurczveil, Palo Alto, CA (US); Di Liang, Palo Alto, CA (US); Bassem Tossoun, Palo Alto, CA (US); Chong Zhang, Palo Alto, CA (US); Xiaoge Zeng, Palo Alto, CA (US); Zhihong Huang, Palo Alto, CA (US); Raymond Beausoleil, Palo Alto (CA)

(73) Assignee: Hewlett Packard Enterprise Development LP, Houston, TX (US)

( * ) Notice: Subject to any disclaimer, the term of this patent is extended or adjusted under 35 U.S.C. 154(b) by 9 days.

(21) Appl. No.: 16/260,256

(22) Filed: Jan. 29, 2019

(65) Prior Publication Data

US 2020/0243701 A1    Jul. 30, 2020

(51) Int. Cl.
*H01L 31/0352* (2006.01)
*H01L 31/0232* (2014.01)
*H01L 31/107* (2006.01)
*H01L 31/0304* (2006.01)

(52) U.S. Cl.
CPC ............. *H01L 31/035218* (2013.01); *H01L 31/02327* (2013.01); *H01L 31/0304* (2013.01); *H01L 31/107* (2013.01)

(58) Field of Classification Search
CPC ..... H01L 51/56; H01L 51/5253; H01L 23/66; H01L 45/1608; C09K 11/06

USPC .......................................................... 257/21
See application file for complete search history.

(56) References Cited

U.S. PATENT DOCUMENTS

| | | | |
|---|---|---|---|
| 4,949,350 A * | 8/1990 | Jewell | B82Y 20/00 257/188 |
| 7,082,248 B1 * | 7/2006 | Morse | G02B 6/12004 385/131 |
| 7,859,746 B2 | 12/2010 | Morito et al. | |
| 8,357,926 B2 | 1/2013 | Wang et al. | |

(Continued)

FOREIGN PATENT DOCUMENTS

CN           105679875           6/2016

OTHER PUBLICATIONS

Elkurdi, M. et al.; "Near-Infrared Waveguide Photodetector with Ge/Si Self-Assembled Quantum Dots"; Jan. 21, 2002; 3 pages.

(Continued)

*Primary Examiner* — Andy Huynh
(74) *Attorney, Agent, or Firm* — Nolte Intellectual Property Law Group

(57) ABSTRACT

A quantum-dot based avalanche photodiode (QD-APD) may include a silicon substrate and a waveguide on which a quantum dot (QD) stack of layers is formed having a QD light absorption layer, a charge multiplication layer (CML), and spacer layers. The QD stack may be formed within a p-n junction. The waveguide may include a mode converter to facilitate optical coupling and light transfer from the waveguide to the QD light absorption layer. The QD absorption layer and the CML layer may be combined or separate layers. The CML may generate electrical current from the absorbed light with more than 100% quantum efficiency when the p-n junction is reverse-biased.

20 Claims, 8 Drawing Sheets

(56) References Cited

U.S. PATENT DOCUMENTS

| | | |
|---|---|---|
| 8,380,032 B2 | 2/2013 | Hasegawa et al. |
| 9,182,647 B2 | 11/2015 | Akiyama |
| 2003/0047752 A1* | 3/2003 | Campbell ............. H01L 31/107 |
| | | 257/186 |
| 2010/0142973 A1 | 6/2010 | Gubenko et al. |
| 2010/0165356 A1 | 7/2010 | Takagi |
| 2010/0245990 A1 | 9/2010 | Tanaka et al. |
| 2017/0207600 A1* | 7/2017 | Klamkin ............. H01S 5/02292 |

OTHER PUBLICATIONS

Piels, M. et al.: "Photodetectors for Silicon Photonic Integrated Circuits"; Oct. 16, 2015; 18 pages.

Umezawa, T. et al.; "Waveguide Avalanche Photodetector Using Quantum-Dot Superlattice for Optical Fiber Communications"; Jul. 31, 2017; 2 pages.

International Search Report and Written Opinion received for PCT Patent Application No. PCT/US2017/19893, dated Nov. 30, 2017, 8 pages.

Ng et al., "Avalanche Multiplication Characteristics of Al0.8Ga0.2As Diodes", IEEE Transactions on Electron Devices, vol. 48, Issue 10, 2001, pp. 2198-2204.

Sandall et al., "1300 nm wavelength InAs quantum dot photodetector grown on silicon", Optics Express, vol. 20, No. 10, May 7, 2012, pp. 10446-10452.

Wan et al., "Monolithically integrated InAs/InGaAs quantum dot photodetectors on silicon substrates", Optics Express, vol. 25, Issue 22, Oct. 30, 2017, pp. 27715-27723.

\* cited by examiner

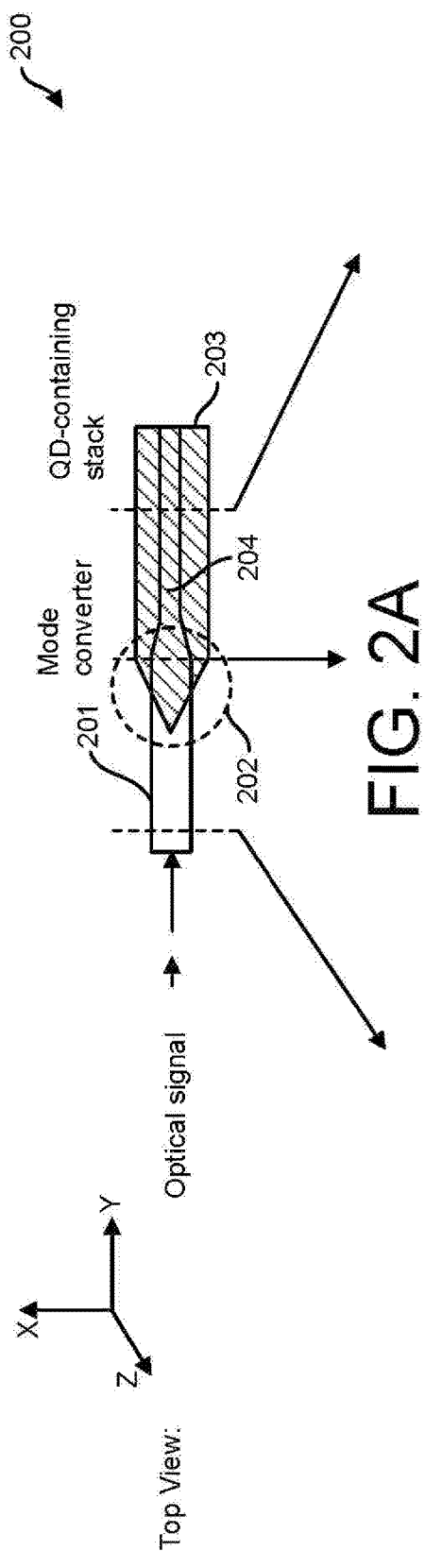

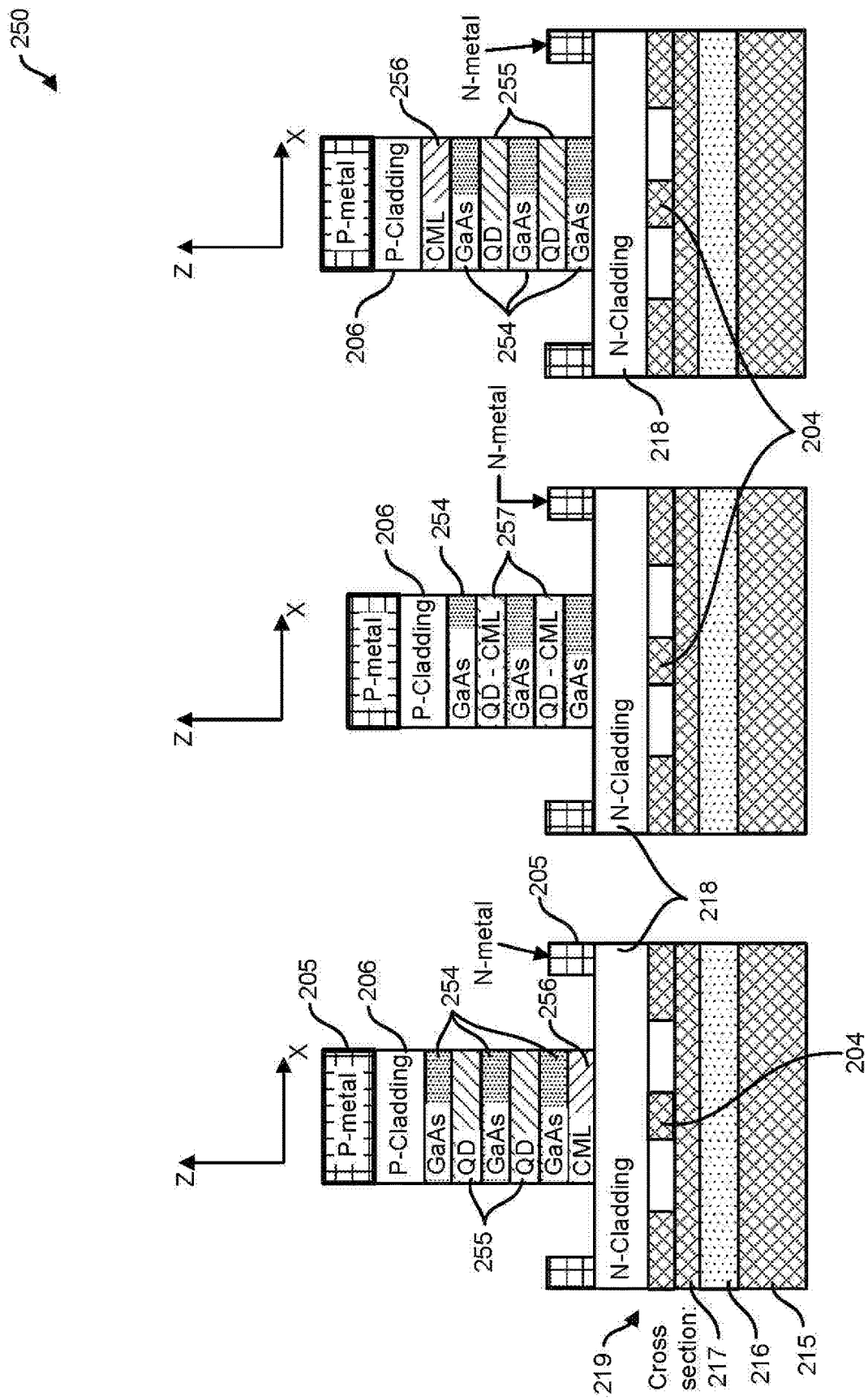

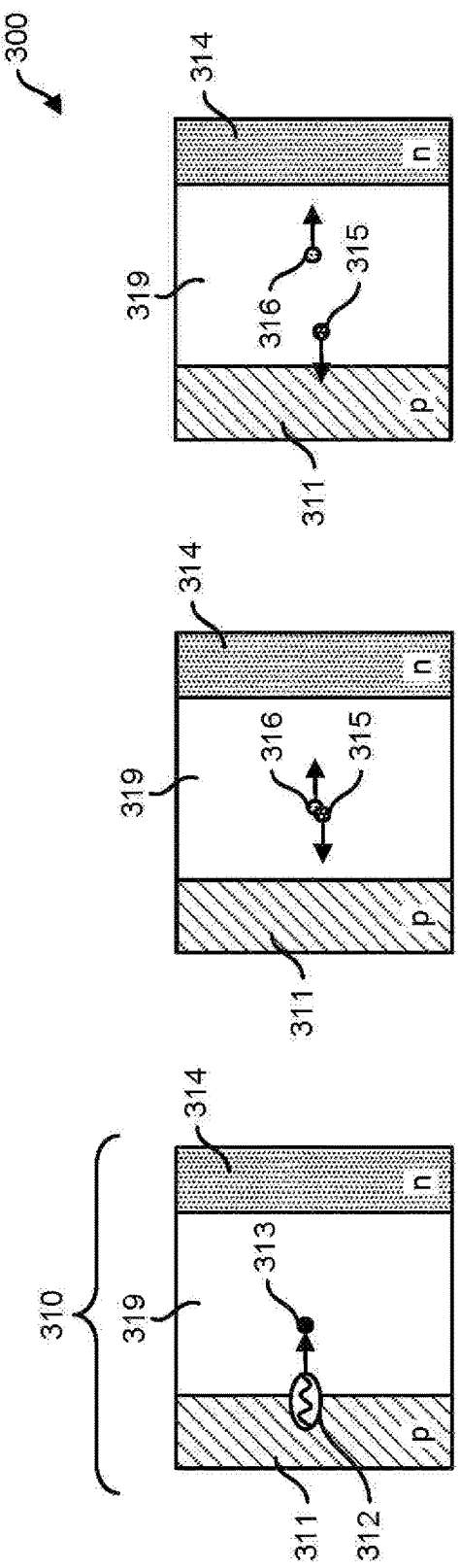
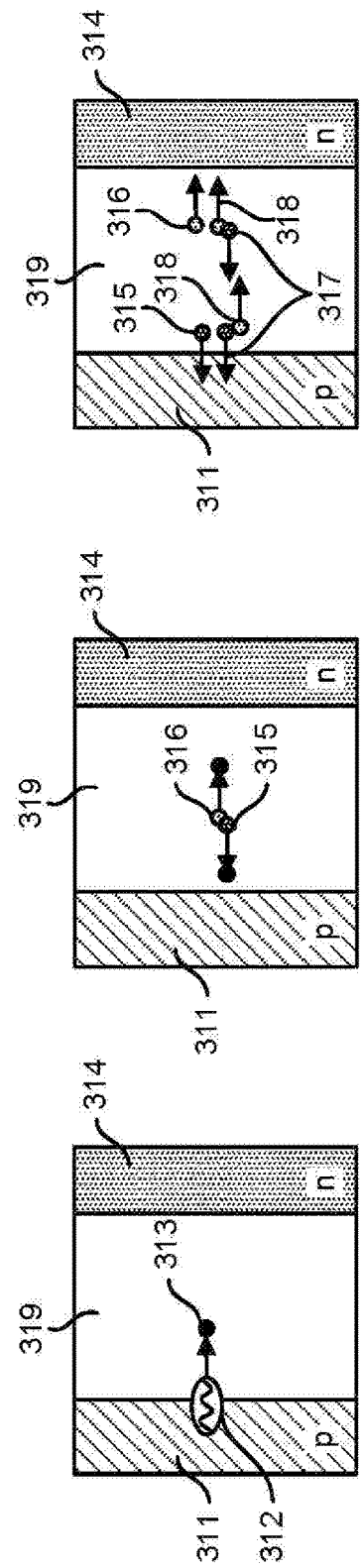
FIG. 3A  FIG. 3B  FIG. 3C
FIG. 3D  FIG. 3E  FIG. 3F

US 10,811,549 B2

QUANTUM-DOT-BASED AVALANCHE PHOTODIODES ON SILICON

STATEMENT REGARDING FEDERALLY SPONSORED RESEARCH OR DEVELOPMENT

This invention was made with Government support under Agreement Number H98230-18-3-0001. The Government has certain rights in the invention.

BACKGROUND

Optical systems may be used to manipulate optical signals in various ways. For example, photodetectors may absorb an optical signal and convert it into an electrical current. As another example, laser diodes may be used to generate lasers by applying a voltage across the diode's p-n junction to make it forward-biased.

BRIEF DESCRIPTION OF THE DRAWINGS

The following detailed description references the drawings, wherein:

FIGS. 2A-2G show examples of structural and layer details of a quantum dot avalanche photodiode (QD-APD);

FIGS. 3A-3C show examples of a p-n junction in non-avalanche, regular mode operation; and FIGS. 3D-3F show examples of a p-n junction in avalanche mode operation;

DETAILED DESCRIPTION

Figure 1:
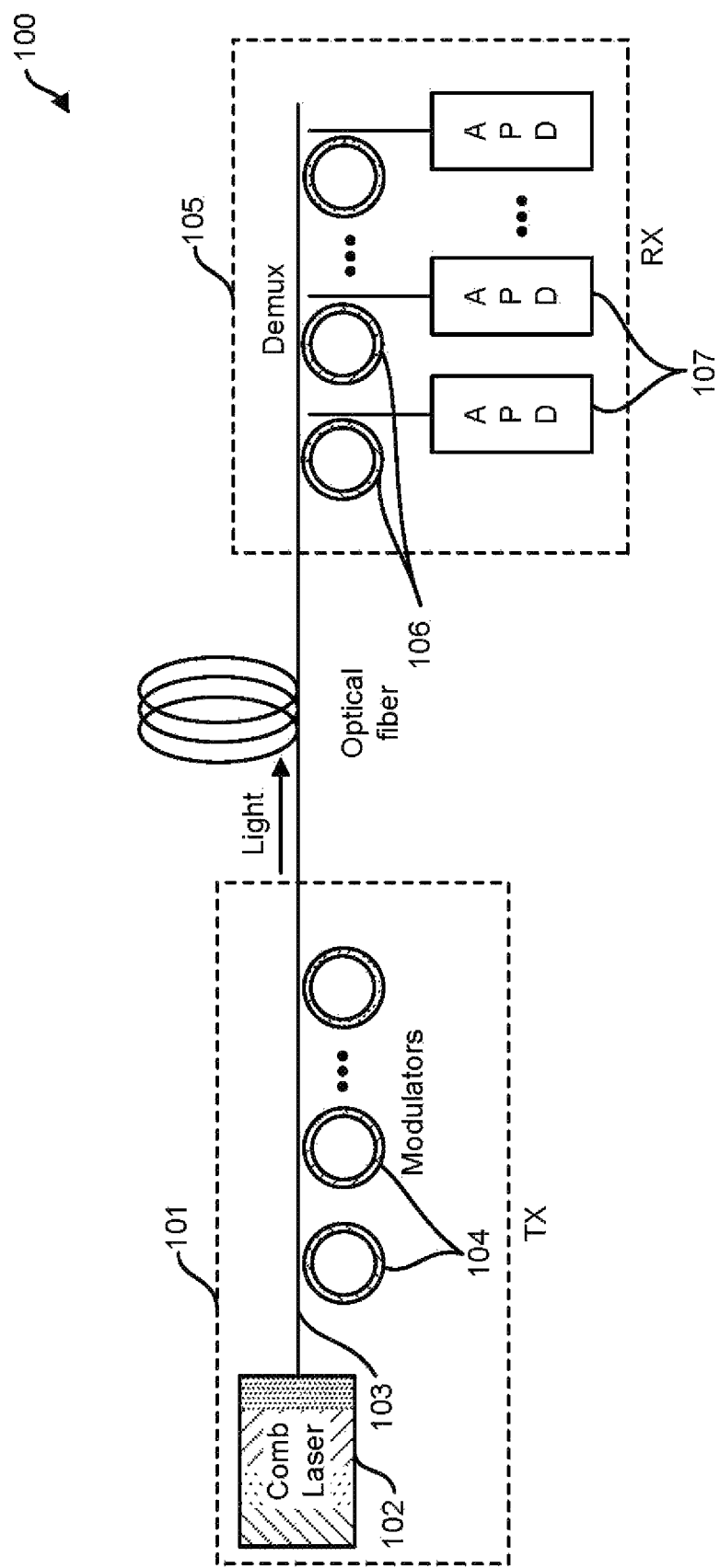
FIG. 1 shows an example dense wavelength division multiplexing (DWDM) system architecture.

The following detailed description refers to the accompanying drawings. Wherever possible, the same reference numbers are used in the drawings and the following description to refer to the same or similar parts. It is to be expressly understood, however, that the drawings are for the purpose of illustration and description only. While several examples are described in this document, modifications, adaptations, and other implementations are possible. Accordingly, the following detailed description does not limit the disclosed examples. Instead, the proper scope of the disclosed examples may be defined by the appended claims.

The terminology used herein is for the purpose of describing particular examples only and is not intended to be limiting. As used herein, the singular forms "a," "an," and "the" are intended to include the plural forms as well, unless the context clearly indicates otherwise. The term "plurality," as used herein, is defined as two or more than two. The term "another," as used herein, is defined as at least a second or more. The term "coupled," as used herein, is defined as connected, whether directly without any intervening elements or indirectly with at least one intervening elements, unless otherwise indicated. Two elements may be coupled mechanically, electrically, or communicatively linked through a communication channel, pathway, network, or system. The term "and/or" as used herein refers to and encompasses any and all possible combinations of the associated listed items. It will also be understood that, although the terms first, second, third, etc. may be used herein to describe various elements, these elements should not be limited by these terms, as these terms are only used to distinguish one element from another unless stated otherwise or the context indicates otherwise. As used herein, the term "includes" means includes but not limited to, the term "including" means including but not limited to. The term "based on" means based at least in part on. The terms "about" and "approximately", used interchangeably, mean up to 5% variation (plus or minus) from a given quantitative value following these terms. The term "adjacent," when applied to two components, regions, or layers, means no other components, regions, or layers, respectively, are physically interposed between the two components.

Optical systems generally Include at least two types of components, those that generate or emit light, such as lasers, and those that detect light, such as photodetectors. Depending on the functions of the optical systems, the light transmitted within the system may represent a signal with certain predefined semantics, or represent optically encoded data. An example of light as a signal is an optical alarm system which may detect light or lack thereof and interpret the signal as an alarm that a restricted area has been breached. Examples of light as encoded data include fiber optic systems used in high-performance computer systems and wide-area or local-area optical networking, which use optical media or links to carry encoded digital data from one source computer or storage to another one. When light is used to carry data, the integrity of the data depends on the quality and sensitivity of light detection because unreliable detection of optical data may result in unreliable data (for example, a false positive or a false negative mistaking binary 1 for binary 0 or vice versa). Accordingly, a highly sensitive light detector may reduce data error, reduce power consumption, increase data density and bandwidth, and provides other benefits as further described below. A QD-APD device may be used to solve some or all of these problems.

Examples disclosed herein describe a QD-APD as a highly sensitive optical detector that may be built on a silicon waveguide to create a highly sensitive light detector. This may be done by creating or forming multiple layers on the passive silicon waveguide including one or more quantum dot (QD) light absorption layers and zero or more charge multiplication layers (CML), alternating with separator layers. In some example implementations, the QD light absorption and CML layers may be combined into one layer. A QD-APD includes three distinct sections along its length. One section is a silicon waveguide section, a second section is a mode conversion transition section, and a third section is a QD section in which the QD/CML is located. Light first enters the silicon waveguide section, then crosses the mode conversion transition section in which the silicon waveguide tapers down and becomes narrower, and the light absorption layer starts small and narrow and then gradually widens and becomes wider. At this point, in the QD section, the avalanche effect takes place.

The QD/CML layers may be reverse-biased to create an avalanche mode of operation with greater than 100% internal quantum efficiency. Internal quantum efficiency excludes the efficiency of the mode converter, described later in detail. In such configuration, one photon creates an electron-hole pair in the absorption layer. Hence, the output from one photon entering the QD-APD is greater than one charged particle (electron or hole). This allows a small amount of light to create a large and usable electrical current (signal) for electronic processing by a circuit or a computer.

Some example implementations described herein disclose a QD-APD operating in avalanche mode with gains resulting in internal quantum efficiencies greater than 100%, as further described below. This type of high-efficiency photodetector may detect minute amounts of light, compared with other implementations.

In some example implementations, the QD-APD includes several layers of QDs separated by spacer layers of material such as Gallium Arsenide (GaAs), and separate CML layers deposited near P-cladding in some examples, or N-cladding in other examples.

There are several advantages provided by such high-efficiency photodetection. One advantage is the output power of a laser can be reduced, thus increasing the efficiency of the optical link.

Another advantage of QD-APDs is that they have inherent gain due to their avalanche mode behavior. Hence, a QD light absorption layer may act as an electrical signal amplifier.

Still another advantage of QD-APDs and a solution to some manufacturing complexity problems is that the same material stack as a diode laser may be used to manufacture the QD-APD. The same design and manufacturing techniques may be used to manufacture both the QD-APDs and QD comb laser and ring laser devices resulting in high-performance photodetectors and lasers. More specifically, simple integration of lasers and photodetectors manufactured this way, using a single bonding step with no selective area bonding, and no high temperature growth steps is possible. Hence, in the same manufacturing process, different devices may be manufactured less expensively that may be integrated more easily in various applications.

Another advantage of QD-APDs integrated on silicon described herein is efficient coupling between passive silicon waveguides, which reduces cost and complexity of systems and system data interfaces.

Still another advantage of QD-APDs is lower dark current than bulk or quantum well photodetectors. Dark current is the random charges, or electric current, generated inside the photodetector without any input light. It is due to random charge generation and recombination of electrons and holes. Dark current is generally not desirable because it distorts the output current or signal of the photodetector and may also result in a false output signal. Dark current in a QD-APD is less sensitive to etching defects and high temperatures in usage.

Turning now to the drawings, FIG. 1 shows an example dense wavelength division multiplexing (DWDM) optical system 100. The DWDM system 100 is an example optical system that includes a laser light generator or emitter and also light detectors, both of which together create an optical data transmission system. The DWDM optical system 100 includes a transmitter 101 having a laser device 102 coupled with an optical fiber 103 and a plurality of modulators 104. The optical fiber 103 is further coupled with a receiver 105 having a plurality of demultiplexing rings 106. The demultiplexing rings 106 are in turn coupled with a plurality of QD-APDs 107.

In some example implementations, the laser device 102 may be a comb laser generating multiple carrier light beams each at a different frequency, or equivalently, a different wavelength. Data may be modulated onto the carrier light beams via the modulators 104. Each of the modulators 104 modulates a different data stream and encodes it onto a different carrier beam. Those skilled in the art will appreciate that a data stream is a series of related data belonging to one data set and serially following each other from a source to a destination. This way, the same optical media, for example, the optical fiber 103, may carry multiple data streams simultaneously without interfering with each other. For short distances, for example on the order of a few inches, the media used may not be a solid or even a material medium but air or a vacuum.

The receiver 105 may receive the modulated carrier beams and then demultiplex them via the demultiplexing rings 106, each demultiplexing ring 106 being tuned to a particular frequency of carrier beam. Thus, each demultiplexing ring 106 in effect filters and separates the carrier to which it is tuned from the multiple streams multiplexed together in the optical fiber 103. The demultiplexing rings 106 are further coupled with QD-APDs 107 that receive a particular frequency of light and convert them, along with the data modulated onto the carrier. This process is further described with respect to FIGS. 4-7 below.

FIGS. 2A-2G show examples of structural and layer details of a QD-APD 200 that may be included in the DWDM system 100 of FIG. 1. Accordingly, the QD-APD 200 may be the same as or similar to one or more of the QD-APDs 107 illustrated in FIG. 1. In some example implementations, with reference to FIG. 2A, QD-APD 200 includes a passive waveguide 201 that extends to a mode converter 202 position or location within the QD-APD structure, as further defined below, and narrows down to a narrower waveguide 204, overlaid with a QD stack 203.

In some example implementations, the passive waveguide 201 may be made of silicon, which may also function as a substrate for other layers, as further described below. The passive waveguide 201 tapers down in the proximity of the QD stack 203 widening. The taper angles with respect to Y-axis may be between about 1° and about 90°. This proximity where the dual tapers take place forms the mode converter 202 in which the light is directed to the QD stack 203 from the passive waveguide 201, as further described with respect to FIGS. 2B-2C below. FIG. 2A is shown in the X-Y plane as indicated by the X-Y-Z reference frame. The QD-APD 200 includes three distinct areas or sections along the Y-axis, including a first section having the passive waveguide 201 (on left of FIG. 2A) at full width, which takes light as its input and carries the light to the mode converter 202. The second section, the mode converter 202, is defined by a narrowing of the passive waveguide 201, which creates a narrowed waveguide section, and the starting and widening of the QD stack 203, which creates a widened QD stack section. So, the mode converter 202 includes portions of the passive waveguide 201 having a tapered region leading to a narrow section 204 of the waveguide, and portions of the QD stack 203 having a sloped region (or having a reverse taper—a taper in the opposite direction—with respect to the tapered region of the waveguide 201) leading to a widened section of the QD stack 203, as shown in FIG. 2A. The third section includes the narrowed waveguide 204 and full width, without taper, QD stack 203. The cross sections of these three areas, in X-Z plane, are shown in FIGS. 2B-2G that follow.

With continued reference to FIG. 2A, the QD-APD 200 disclosed herein includes a QD light absorber material. The QD light absorber material may be or may Include various III-V semiconductors (with reference to Groups III-V of the periodic table of elements), for example, Indium Arsenide (InAs), GaAs, Indium Phosphorus (InP), and the like, and may be bonded on top of the passive waveguide 201, as further described in more detail below. Light may be coupled from the passive waveguide 201 to enter the QD stack 203 using the mode converter 202.

Light absorption in the QD stack 203, further described below, and charge amplification may occur in the same epitaxial layer, in some example implementations, and may happen in different epitaxial layers in other example implementations. As described later in more detail with reference to FIGS. 2B-2G, the QD stack 203 is a layered light absorption region, which may include two or three distinct light absorption layers including a QD layer, a CML layer, and an spacer layer separating the other layers. In some example implementations the QD layer and the CML layer may be combined into a QD-CML layer. Multiple such light absorption layers may be formed in the QD stack 203. In some example implementations, the charge amplification may be dominated by electrons. In this case, a CML may be formed separately and distinctly from the QD layer adjacent to a P-cladding 206 as shown and described later with respect to FIG. 2E. The CML may be made of $Al_xGa_{1-x}As$ (0<x<1) or other equivalent material compositions. In some implementations, the QD light absorption layers themselves may be or may include the CML. A typical epitaxial stack may contain between 1 and 10 QD light absorption layers. In other example implementations, more than 10 QD light absorption layers may be formed.

According to one or more implementations, FIG. 2B shows an example cross-section in X-Z plane at the first section of the QD-APD 200, as shown in FIG. 2A. The layers shown include a substrate 219 having a lower silicon layer 215 at the bottom, a buried oxide (BOX) layer 216 in the middle, and an upper silicon layer 217 at the top, arranged with respect to the X-Z reference frame shown. The passive waveguide 201 is created on top of the silicon substrate 219. The number and arrangement of these components is an example only and provided for purposes of illustration. Other arrangements and numbers of components may be utilized without departing from the examples of the present disclosure. A light mode profile 208 shows a spatial light distribution of a certain size at this cross-section, which is restricted to the silicon waveguide. The light mode profile changes as the QD-APD 200 is traversed along the Y-axis.

Continuing on to the second cross-section of the three QD-APD 200 sections, according to one or more implementations, FIG. 2C shows a cross-section at the mode converter 202 of FIG. 2A. The substrate 219 cross-section is as described with respect to FIG. 2B above. The passive waveguide 201 is layered on top of the silicon substrate 219. The width of the passive waveguide 201, along the X-axis, remains the same as the first section before the taper starts. The next layer on top of the passive waveguide 201 is an N-cladding 218. Next, the QD stack 203 is added on top of the N-cladding 218. The structure of the QD stack 203 is further described below with respect to FIGS. 2E and 2F. A P-cladding 206 is the next layer on top of the QD stack 203. A metal electrical contact layer 205 is added on top of the P-cladding 206 to inject current into the QD-APD structure. A mode profile 209 of the light in this section is different from the mode profile 208 of the first section. In this mode profile, a light outflow 211 is spatially expanded into the absorption region along Z-axis defined and occupied by the QD stack 203. The light outflow 211 thus entering the QD stack 203 is the input to the p-n junction that when reverse-biased causes the generation of electric charges, namely, electrons and holes, forming an electrical current that may be further detected and processed by electronic circuits and computers.

With reference to FIGS. 2A to 2C, the width of passive waveguide 201 included in the QD-APD 200 along the X-axis of FIGS. 2B and 2C may range from about 300 nm to about 2 μm and the thickness of passive waveguide 201 along the Z-axis may range from about 200 nm to about 500 nm. The width of the QD stack 203, except in the sloped or tapered region, may range from about 1 μm to about 10 μm and the thickness of the QD stack 203 may range from about 100 nm to about 500 nm. The width of the QD stack 203 along the X-axis may generaly be greater than the width of passive waveguide 201 at any of its varying widths.

Now, with reference to FIG. 2D, a cross-section of the third section of the QD-APD 200 is the same as FIG. 2C, except for the width of the passive waveguide 201, which is now reduced, as shown in FIG. 2A also. Accordingly, a mode profile 210 of the light is also changed to a spatially more expanded form and further inside the QD stack 203 area.

FIGS. 2E-2G show some example implementations of the QD stack 203 in the QD-APD 200 of FIG. 2D. FIG. 2E shows one example implementation of the QD stack 203. In this example implementation, a CML layer 256 is created immediately on top of or adjacent to the N-cladding 218, where no other layer is interposed between the CML layer 256 and the N-cladding 218. The spacer layers 254, made of GaAs in some implementations, separate QD light absorption layers 255 from other layers, as shown. The QD light absorption layers 255 absorb light and start the charge generation process as described below with respect to FIGS. 3A-3C. The CML layer 256 multiplies the charge in avalanche mode as described below with respect to FIGS. 3D-3F. The QD light absorption layers 255 may include an absorption region to absorb photons from the received optical signal. In some implementations, the entire QD light absorption layer 255 may be the absorption region, whereas in other implementations a portion of the QD light absorption layer 255 may make up the absorption region.

FIG. 2F shows another example implementation of the QD stack 203. In this example implementation, the QD light absorption layers 255 and the CML layer 256 (shown separately in FIG. 2E) are combined together into QD-CML layers 257. The spacer layers 254 separate the QD-CML layers 257.

FIG. 2G shows another example implementation of the QD stack 203. In this example implementation, the QD light absorption layers 255 are separated from each other by the spacer layers 254, and the CML layer 256 is formed next to or adjacent to the P-cladding 206, as shown in the figure, where no other layer is Interposed between the CML layer 256 and the P-cladding 206.

FIGS. 3A-3C show examples of a p-n junction of the QD-APD 200 in non-avalanche, regular mode operation. FIG. 3A shows an example p-n junction 310, with a positively doped (p-type semiconductor with excess holes) region 311 and a negatively doped (n-type semiconductor with excess electrons) region 314 separated by an absorption region 319. Light, in the form of photons 312, enters the absorption region 319 and generates an electron-hole pair, including an electron, which then impacts an atom 313.

With reference to FIG. 3B, photo-generated carriers based on photon 312 (FIG. 3A) may ionize the atom 313 (FIG. 3A) into an electron-hole pair including hole 315 and electron 316.

With reference to FIG. 3C, in a reverse-biased p-n junction, the electron 316 is attracted towards the negatively doped region 314 and the hole 315 is attracted towards the positively doped region 311. With many such carrier-atom impacts, an electrical current is set up in the p-n junction 310.

The maximum quantum efficiency of non-avalanche mode of operation is 100%, indicating that each photon 312 (considered as an input to the p-n junction) generates at most one electron-hole pair as the electrical charge (considered as an output from the p-n junction).

FIGS. 3D-3F show examples of a p-n junction in avalanche mode operation. With reference to FIG. 3D, the avalanche mode of operation of a p-n junction 310 is described. The structure of the p-n junction is the same as described earlier with respect to FIGS. 3A-3C. The operation at this point is identical or similar to FIG. 3A, in which a photon 312 enters the absorption region between the positively doped region 311 and the negatively doped region 314 and impacts an atom 313.

FIG. 3E shows an example ionization of an atom 313 (FIG. 3D) into an electron-hole pair, as described with respect to FIG. 3B. In the avalanche mode of operation, the initial or early electron-hole pairs created are called parent pairs because they may generate other electron-hole pairs, which are called child pairs. Subsequently, each child pair may generate their own child pairs, and so on.

FIG. 3F shows an example avalanche process, which is the main difference between the avalanche mode of operation and the non-avalanche mode shown in FIG. 3C. At this stage, the parent electron-hole charge(s) may impact and ionize other atoms 313 and generate additional electron-hole pairs, as their children. This process may continue starting with each photon 312 (FIG. 3D) and continuing with each electron-hole pair generated as a result, generating even more children. With continued reference to FIG. 3F, the parent hole 315 and parent electron 316 may impact other atoms in turn and generate their own (without a photon) child holes 317 and child electrons 318. Hence, the quantum efficiency of the avalanche mode of operation may well exceed 100%, because one photon 312 (input) may eventually generate more than one electron-hole pair (output).

Figure 4:
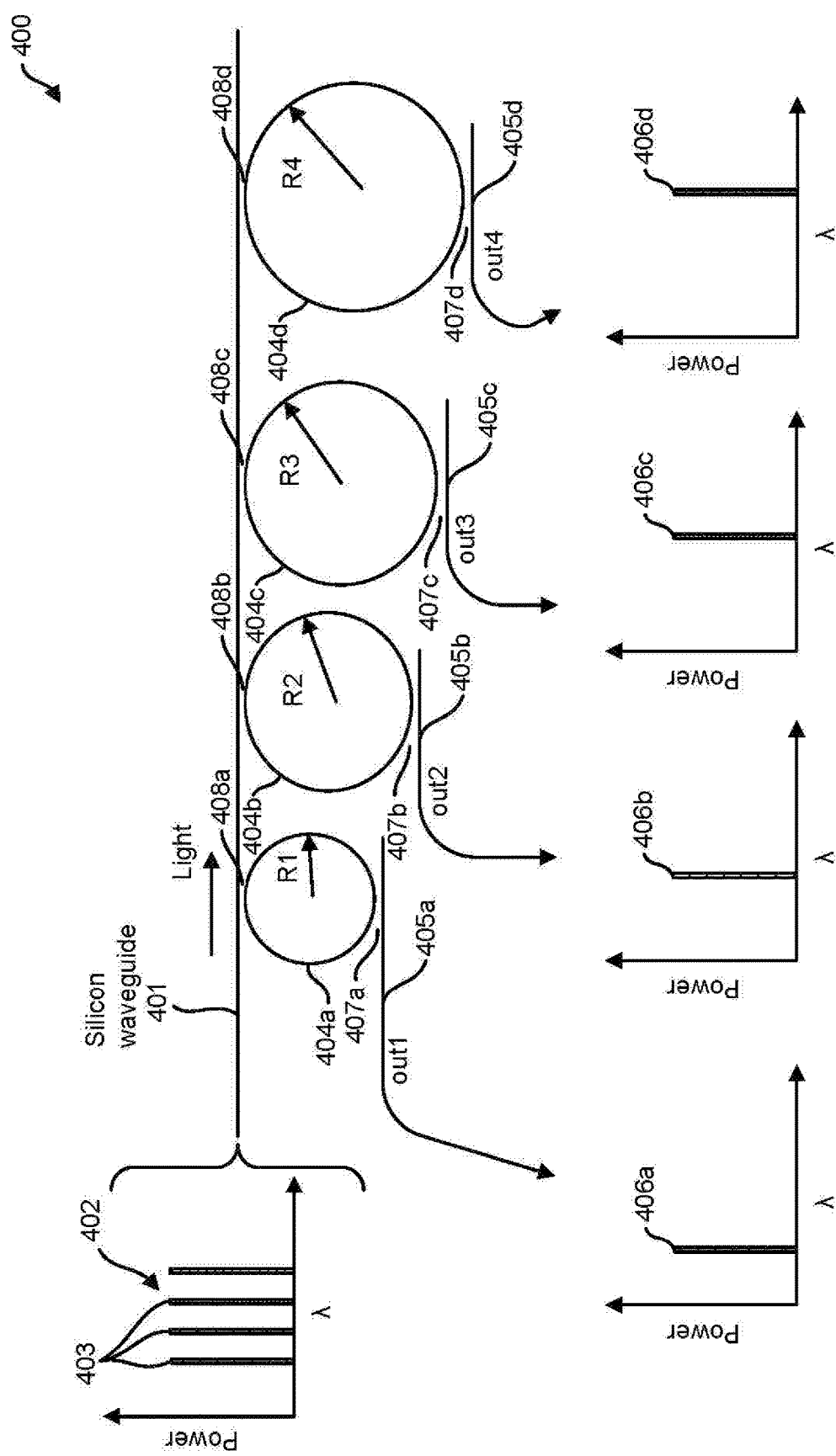
FIG. 4 shows examples of evanescent coupling between a waveguide and several demultiplexing ring waveguides of various sizes.

FIG. 4 shows examples of evanescent coupling between a waveguide 401 and several demultiplexing ring waveguides 404a-404d of various sizes. As discussed with respect to FIG. 1, a laser device 102 may be used to transmit data modulated thereon. Several light frequencies, or equivalently, wavelengths $\lambda$, may be generated by the laser device, for example, a comb laser, and combined and transmitted over one optical media, such as an optical fiber 103. A wavelength vs. power graph 402 shows several distinct carriers with different wavelengths 403 being transmitted via a waveguide 401. A number of ring waveguides 404a-404d each having a different radius R1-R4, respectively, are coupled with the waveguide 401 via evanescent coupling through small air gaps 408a-d, respectively, on the order of about 0.2 μm or more or less as desired. The waveguide rings 404a-404d are further coupled with QD-APD waveguides 405a-d, via other air gaps 407a-407d, respectively. Each of the QD-APD waveguides 405a-d receives the corresponding data stream with distinct carrier wavelengths 406a-d, from the respective waveguide rings 404a-404d.

Optical evanescent coupling is used to transfer light between an optical transport, such as a waveguide, to semiconductor devices, such as photodetectors that use or process the light. The waveguide rings 404a-404d inherently operate in a narrow bandwidth by resonance. As a result, the rings may be tuned to particular frequencies. In practice, the tuning is done by choosing the appropriate radius for the waveguide rings and can be further fine-tuned by a heater and/or a MOS-tuner (metal oxide semiconductor tuner). This way, each ring separates a particular carrier with the frequency tuned to the radius of the ring, which is subsequently passed on to the corresponding QD-APD waveguide.

Figure 5:
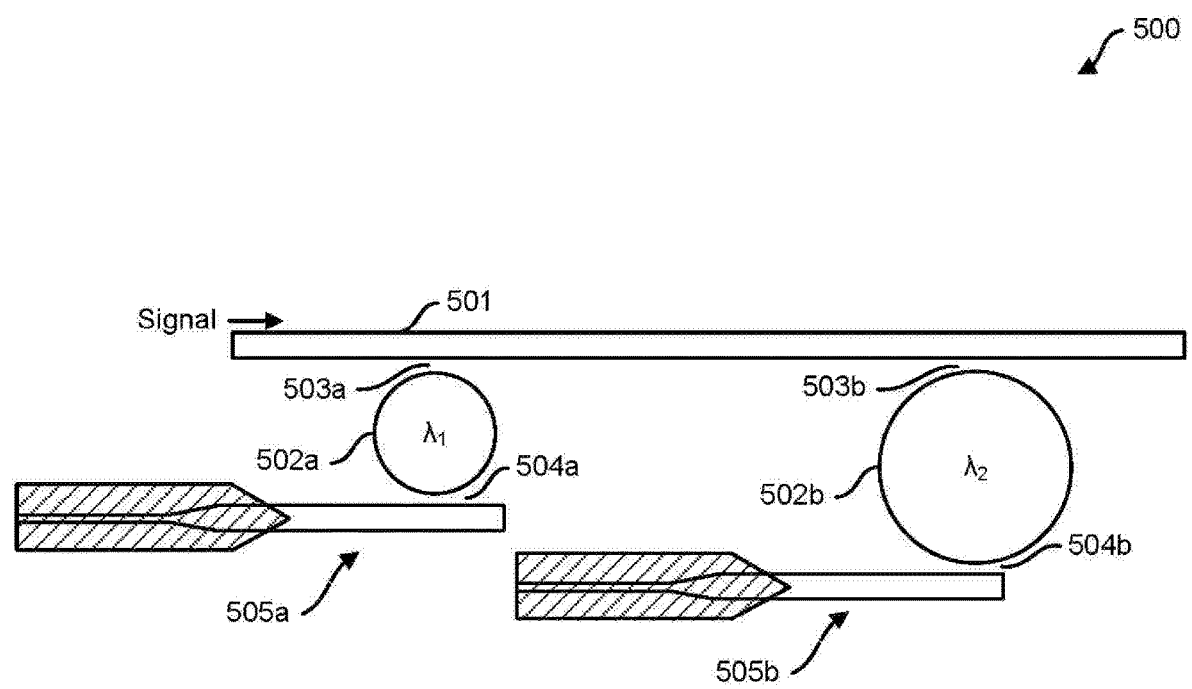
FIG. 5 shows examples of evanescent coupling between a waveguide and several QD-APDs via demultiplexing ring waveguides of various sizes.

FIG. 5 shows examples of evanescent coupling between a waveguide and several QD-APDs via demultiplexing tuning ring waveguides of various sizes. The example evanescent coupling arrangement 500, shows a waveguide 501 carrying an optical signal and coupled with the demultiplexing tuning ring waveguides 502a and 502b, tuned to different wavelengths $\lambda_1$ and $\lambda_2$ via air gaps 503a and 503b, respectively. The demultiplexing tuning ring waveguides 502a and 502b are in turn coupled with QD-APDs 505a and 505b via air gaps 504a and 504b, respectively.

With this arrangement, each of several optical signals transmitted by optical media, such as an optical fiber, are separated by the demultiplexing tuning ring waveguides 502a and 502b and transferred to the appropriate QD-APD for detection and subsequent electrical charge generation.

Figure 6:
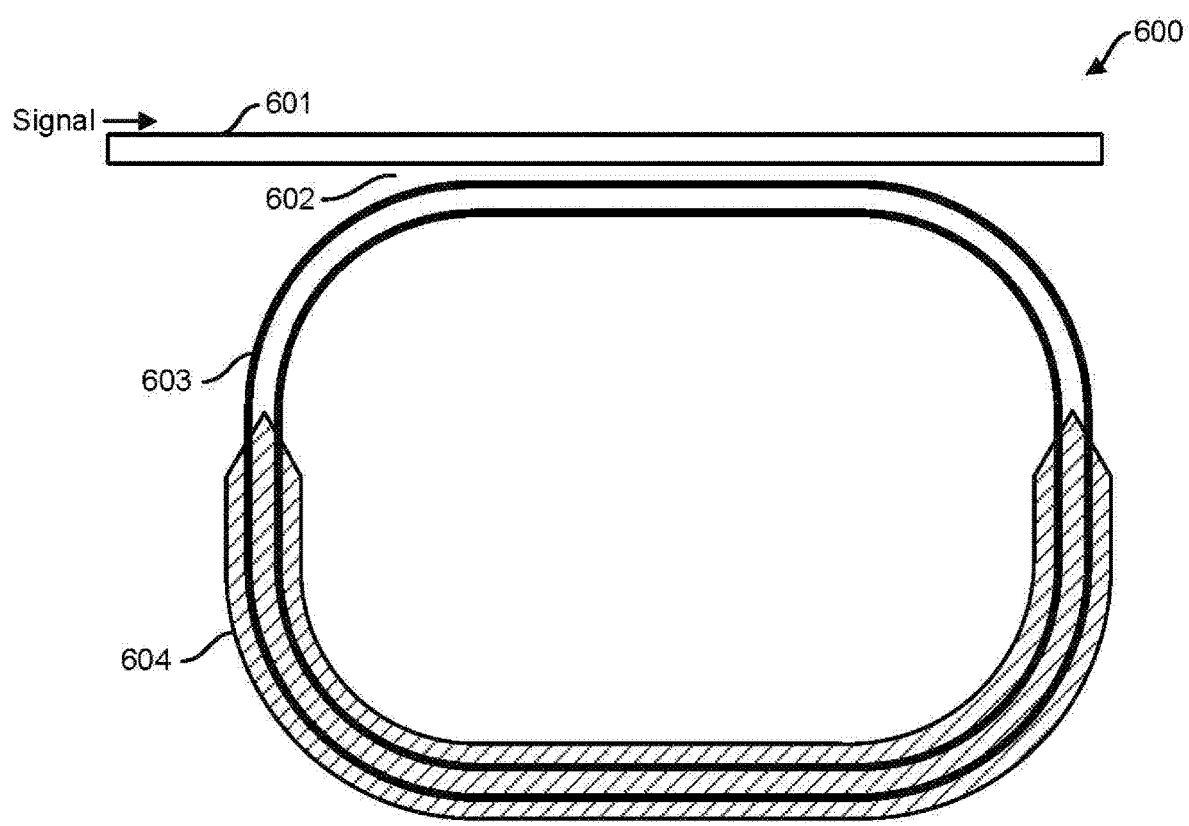
FIG. 6 shows an example evanescent coupling arrangement with a waveguide coupled with a partial QD-APD demultiplexing ring waveguide.

FIG. 6 shows an example evanescent coupling arrangement with a waveguide coupled with a partial QD-APD demultiplexing ring waveguide. The example evanescent coupling arrangement 600 shows a waveguide 601 carrying an optical signal and coupled with a tuning ring waveguide 603 via an air gap 602. The tuning ring waveguide 603 is implemented as a QD-APD with QD stack 604 covering less than the entire tuning ring waveguide 603. The optical signal may travel multiple times around the waveguide ring 603, thereby having multiple opportunities to be absorbed in the absorption region of QD Stack 604, which improves the overall absorption and efficiency of the QD-AFD.

In this arrangement, the tuning ring waveguide 603 is implemented as a QD-APD and performs both the function of tuning and separating the optical signal from the waveguide 601 and the function of detecting the light signal. This way the optical data transmission system may be simplified and be produced at lower cost.

Figure 7:
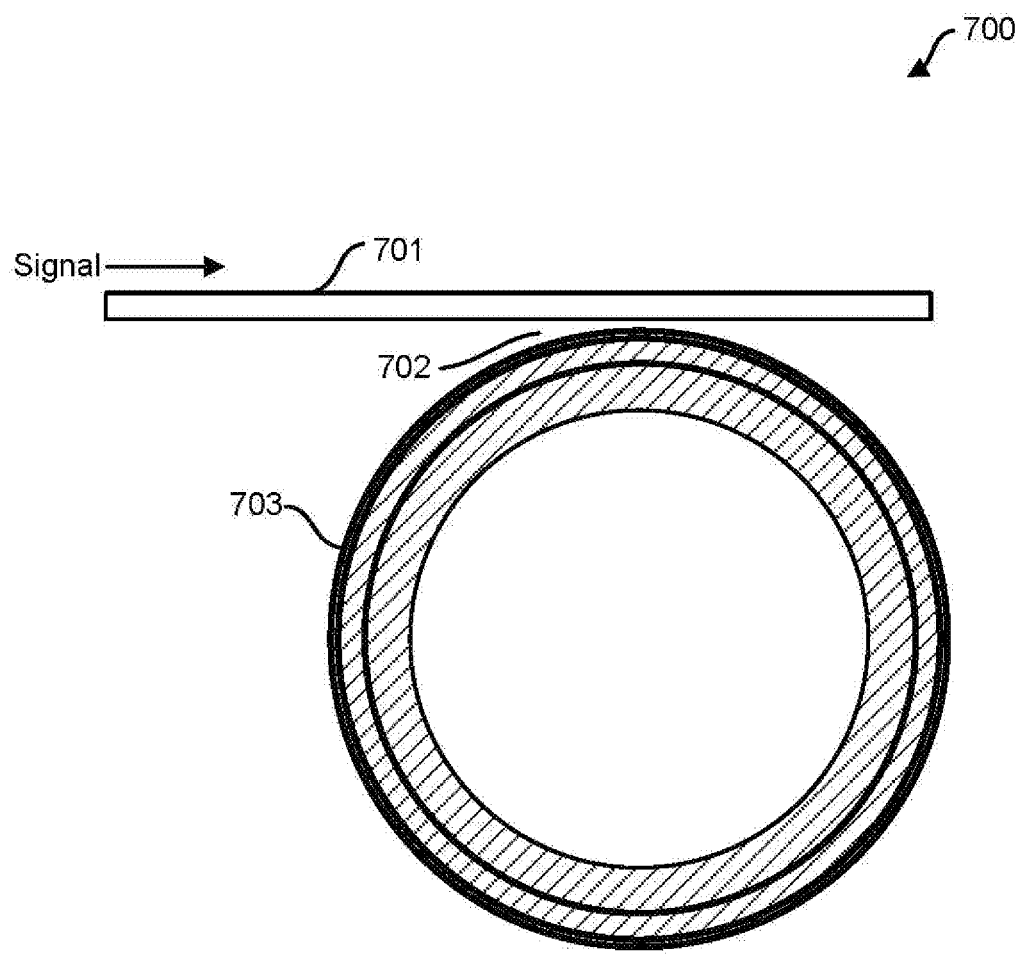
FIG. 7 shows an example evanescent coupling arrangement with a waveguide coupled with a full QD-APD demultiplexing ring waveguide.

FIG. 7 shows an example waveguide coupled with a full QD-APD demultiplexing ring waveguide. The example evanescent coupling arrangement 700 shows a waveguide 701 carrying an optical signal and coupled with a tuning ring waveguide 703 via an air gap 702. The tuning ring waveguide 703 is implemented as a fully formed QD-APD with QD stack covering the entire tuning ring waveguide 703. The optical signal may travel multiple times around the tuning ring waveguide 703, thereby having multiple opportunities to be absorbed in the absorption region of QD light absorption layers, which improves the overall absorption and efficiency of the QD-AFD.

In this arrangement, the tuning ring waveguide 703 is implemented as a QD-APD and performs both the function of tuning and separating the optical signal from the waveguide 701 and the function of detecting the light signal. This way the optical data transmission system may be simplified and be produced at lower cost.

The foregoing disclosure describes a number of example implementations of a QD-APD. For purposes of explanation, certain examples are described with reference to the components illustrated in FIGS. 1 to 7. The functionality of the illustrated components may overlap, however, and may be present in a fewer or greater number of elements and components. Further, all or part of the functionality of illustrated elements may co-exist or be distributed among several geographically dispersed locations. Moreover, the disclosed examples may be Implemented in various environments and are not limited to the illustrated examples. Thus, the present disclosure merely sets forth possible examples of implementations, and many variations and modifications may be made to the described examples. All such modifications and variations are intended to be included within the scope of this disclosure and protected by the following claims.

The invention claimed is:

1. A quantum-dot based avalanche photodiode (QD-APD), comprising:
 a waveguide to receive light;
 a quantum dot (QD) stack of layers formed on top of the waveguide and deployed in a middle of a semiconductor p-n junction to receive light from the waveguide and generate an electric current with greater than one hundred percent (100%) internal quantum efficiency when the semiconductor p-n junction is reverse-biased; and
 a mode converter to couple the light received by the waveguide to the QD stack of layers.

2. The QD-APD of claim 1, further comprising a P-cladding layer and an N-cladding layer enclosing the QD stack of layers on a top and a bottom of the QD stack of layers.

3. The QD-APD of claim 1, wherein the waveguide comprises a passive silicon waveguide.

4. The QD-APD of claim 1, wherein the QD stack of layers comprises at least one QD light absorption layer and at least one spacer layer.

5. The QD-APD of claim 4, wherein the QD light absorption layer comprises at least one of InAs (Indium-Arsenide), GaAs (Gallium-Arsenide), and InP (Indium-Phosphorus).

6. The QD-APD of claim 1, wherein the mode converter comprises a section of the QD-APD wherein a portion of the waveguide tapers to a narrower width in a first direction and a portion of the QD stack of layers tapers down to a narrower width in a second direction opposite the first direction.

7. The QD-APD of claim 1, wherein the QD stack of layers receives light from the waveguide via an optical evanescent coupling.

8. A quantum-dot based avalanche photodiode (QD-APD), comprising:
 a waveguide to receive light;
 a quantum dot (QD) stack of layers formed on top of the waveguide and including:
  a plurality of QD light absorption layers within a semiconductor p-n junction to absorb light, the plurality of QD light absorption layers separated by spacer layers, and
  a charge multiplication layer (CML) to multiply electrical charges with greater than one hundred percent (100%) internal quantum efficiency in response to the light absorbed when the semiconductor p-n junction is reverse-biased.

9. The QD-APD of claim 8, further comprising an N-cladding or a P-Cladding adjacent to the CML.

10. The QD-APD of claim 8, wherein the light absorbed by the plurality of QD light absorption layers is directed from the waveguide to the plurality of QD light absorption layers by a mode converter.

11. The QD-APD of claim 10, wherein the mode converter includes a tapered region of the waveguide and a sloped region of the QD stack of layers.

12. The QD-APD of claim 11, wherein a width of the QD stack of layers is larger than a width of any portion of the waveguide.

13. The QD-APD of claim 8, wherein the CML multiplies electrical charges with greater than one hundred percent (100%) quantum efficiency during operation in avalanche mode.

14. The QD-APD device of claim 8, wherein the waveguide receives light via a demultiplexing ring waveguide tuned to a particular wavelength.

15. A quantum-dot based avalanche photodiode (QD-APD), comprising:
 a waveguide to receive light;
 a quantum dot (QD) stack of layers formed on top of the waveguide and including:
  a plurality of QD and charge multiplication layers (QD-CML) within a semiconductor p-n junction, the plurality of QD-CML to absorb light and to multiply electrical charges with greater than one hundred percent (100%) quantum efficiency in response to the light absorbed when the p-n junction is reverse-biased, and
  a plurality of spacer layers to separate the plurality of the combined QD-CML.

16. The QD-APD of claim 15, further comprising an N-metal contact coupled with an N-cladding adjacent to a first end of the QD stack of layers and a P-metal contact coupled with a P-cladding adjacent to a second end of the QD stack of layers.

17. The QD-APD of claim 15, wherein a mode converter, including portions of both the waveguide and the QD stack of layers, divides the QD-APD into three distinct sections including a waveguide section, a mode converter section, and a QD section.

18. The QD-APD of claim 17, wherein a width of the waveguide tapers down to a narrower width creating a narrowed waveguide at the mode converter section, and the QD stack widens to a wider width creating a widened QD stack section at the mode converter section.

19. The QD-APD of claim 18, wherein an optical mode profile changes in each of the three distinct sections when light flows from the waveguide section toward the QD section.

20. The QD-APD of claim 19, wherein the optical mode profile of the QD section spatially moves from the narrowed waveguide and expands in the widened QD stack section.

* * * * *